(12) United States Patent  
Yamashita

(10) Patent No.: US 6,501,175 B2  
(45) Date of Patent: Dec. 31, 2002

(54) SEMICONDUCTOR DEVICE WITH SEMICONDUCTOR CHIP ON FLEXIBLE TAPE

(75) Inventor: Chikara Yamashita, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/878,197

(22) Filed: Jun. 12, 2001

(65) Prior Publication Data

US 2001/0050418 A1 Dec. 13, 2001

(30) Foreign Application Priority Data

Jun. 12, 2000 (JP) ........................................ 2000-175674

(51) Int. Cl.⁷ .............................................. H01L 23/48
(52) U.S. Cl. ...................... 257/737; 257/678; 257/692; 257/782
(58) Field of Search ................. 257/678, 692, 257/693, 698, 700, 737, 738, 778, 782; 438/108, 112, 127, 613

(56) References Cited

U.S. PATENT DOCUMENTS

| | | | | |
|---|---|---|---|---|
| 5,397,917 A | * | 3/1995 | Ommen et al. | 174/16.3 |
| 5,734,201 A | * | 3/1998 | Djennas et al. | 257/684 |
| 6,107,679 A | * | 8/2000 | Noguchi | 257/678 |
| 6,114,763 A | * | 9/2000 | Smith | 257/692 |
| 6,294,405 B1 | * | 9/2001 | Higgins, III | 257/782 |

FOREIGN PATENT DOCUMENTS

JP          10-125721        5/1998

OTHER PUBLICATIONS

Tsuyoshi Ishihara et al., "Reduced Parasitic Inductances in BGA Package using Floating Conductive Plane", *Technical Report of IEICE* CPM 99–134, ICD99–230 (Dec. 1999), p. 45–52.

* cited by examiner

*Primary Examiner*—David Nelms  
*Assistant Examiner*—Dao H. Nguyen  
(74) *Attorney, Agent, or Firm*—Young & Thompson

(57) ABSTRACT

A plane layer and a number of thin filamentary interconnection patterns disposed therearound are disposed on the upper surface of a flexible insulating tape. A semiconductor chip is mounted on the plane layer on the insulating tape by flip-chip bonding, and has terminals on its reverse side which are connected to the plane layer and the interconnection patterns, respectively. Some of the terminals of the semiconductor chip are connected through the plane layer to solder balls, providing ground interconnections. Other terminals are connected to the interconnection patterns to other solder balls, providing power supply interconnections. Still other terminals are connected to other interconnection patterns to still other solder balls, providing signal interconnections. The semiconductor device can simply be fabricated, requires no device hole for semiconductor chip, can be reduced in size, have electric interconnected reduced, and can have electric characteristics stabilized.

9 Claims, 9 Drawing Sheets

SEMICONDUCTOR DEVICE WITH SEMICONDUCTOR CHIP ON FLEXIBLE TAPE

BACKGROUND OF THE INVENTION

1. Field of the Invention

The present invention relates to a semiconductor device, and more particularly to a semiconductor device with a semiconductor chip mounted on a flexible tape.

2. Description of the Related Art

In recent years, semiconductor devices (semiconductor packages) tend to have more pins and to have components mounted at higher density in order to meet requirements for smaller sizes and higher performance for electronic devices. As a result, the leads extending from semiconductor packages are spaced at smaller pitches, which make it difficult to install semiconductor packages on boards by gang reflow soldering. For this reason, more surface-grid-terminal-mounted semiconductor devices such as BGAs (Ball Grid Arrays) which are mounted by conductive protrusions such as solder balls on lower surfaces are employed in the art than peripheral-lead-mounted semiconductor devices such as QFP (Quad Flat Packages) which are mounted by leads on peripheral edges because the former semiconductor devices can have increased pitches.

Heretofore, semiconductor chips in semiconductor devices and leads thereof are mostly electrically connected by wire bonding. However, recent trends toward more pins on semiconductor devices result in reduced pitches between terminals (pads) on semiconductor chips, which make it difficult to connect the terminals and leads to each other by wire bonding. In view of the difficulty, attention has been directed to TAB (Tape Automated Bonding) as a substitute for wire bonding. TAB is a process of bonding inner leads mounted on a flexible insulating tape and having ends extending to a position for contact with terminals on a semiconductor chip, to bumps on the terminals on the semiconductor chip. According to TAB, it is possible to reduce the pitch of chip terminals to about 60 μm. Surface-grid-terminal-mounted semiconductor devices installed on TAB are referred to as Tape-BGAs.

For fabricating conventional Tape-BGA semiconductor devices, attachment holes (device holes) are defined in regions of an insulating tape where semiconductor chips are positioned. Specifically a semiconductor chip is positioned in a device hole in an insulating tape, and is supported only by inner leads that are connected to terminals of the semiconductor chip.

Since all the weight of the semiconductor chip is borne by the inner leads, the inner leads need to have a high mechanical strength in the Tape-BGA semiconductor device. Before the semiconductor chip is installed on the insulating tape, it is necessary to exercise care in handling the insulating tape not to damage or deform the inner leads because part of the inner leads project into the device hole.

All electric interconnections are required to be disposed on the insulating tape around the device hole because the device hole is an area that cannot be used for electric interconnections and mounting. Since a space is needed on the insulating tape for accommodating a number of electric interconnections therein, there is a certain limitation to attempts to reduce the size of the insulating tape. Such electric interconnections have to be long enough to extend from the inner leads to conductive protrusions (solder balls) and thin enough to accommodate more pins, and are required to have a complex layout. However, long electric interconnections adversely affect electric characteristics of the semiconductor device, e.g., an increased impedance.

Usually, semiconductor devices of the type described above have electric interconnections classified into three groups, i.e., power supply interconnections, ground interconnections, and signal interconnections. All the electric interconnections of these three types extend on the insulating tape. Those electric interconnections which are connected to conductive protrusions (solder balls) that are positioned remotely from terminals (pads) of the semiconductor chip are long and hence have a high inductance, tending to cause a level of noise that cannot be ignored. Moreover, since different electric interconnections are connected respectively to all the terminals, the number of pins used is large, and the electric interconnections are arranged in a complex pattern.

Japanese laid-open patent publication No. 125721/1998 discloses an insulating tape which does not have attachment holes (device holes). The disclosed insulating tape has through holes defined at positions facing the terminals of a semiconductor chip. The semiconductor chip is mounted on the insulating tape by through hole bonding, and the terminals thereof are connected to electric interconnections on the reverse side of the insulating tape via the through holes. Though the insulating tape has no attachment holes (device holes), the insulating tape suffers a significant disadvantage in the semiconductor device fabrication process because it is highly complex and time-consuming to perform through hole bonding. Specifically, the process of producing through holes is complicated because it is necessary to define minute through holes in the insulating tape, form interconnections in the through holes, and fill the through holes with a synthetic resin, if necessary. In addition, the process of installing the semiconductor chip on the insulating tape is also highly complex and time-consuming because the semiconductor chip needs to be positioned highly accurately with respect to the through holes and then bonded in position. Accordingly, the through hole bonding technique is liable to make the semiconductor device fabrication process very complicated.

SUMMARY OF THE INVENTION

It is therefore an object of the present invention to provide a semiconductor device which requires no device hole, can be reduced in size, have short electric interconnections and stable electric characteristics, and can be fabricated by a relatively simple fabrication process.

According to the present invention, a semiconductor device includes a flexible insulating tape, a semiconductor chip mounted on a face side of the insulating tape by flip-chip bonding, a plane layer disposed in a region of the face side of the insulating tape substantially directly beneath the semiconductor chip, a plurality of filamentary interconnection patterns disposed in a region of the face side of the insulating tape substantially around the semiconductor chip, and a plurality of conductive protrusions disposed in respective openings defined in the insulating tape. The plane layer is held in contact with selected ones of a plurality of terminals of the semiconductor chip. The interconnection patterns are electrically independent of the plane layer and held in contact with remaining ones of the terminals of the semiconductor chip. The conductive protrusions are held in contact with the plane layer and selected ones of the interconnection patterns, and exposed on a reverse side of the insulating tape With the above arrangement, since the semiconductor device has the plane layer to which a plurality of terminals are connected, the number of fine filamentary interconnection patterns is reduced, the layout thereof is made less complex, and the arrangement thereof is simplified. Furthermore, since the region directly beneath semiconductor chip is effectively utilized for electric interconnections, the semiconductor device may be reduced in size. Because the length of interconnections from the terminals through the plane layer to the conductive protrusions is small, the impedance thereof is small and the electric characteristics thereof are improved, allowing semiconductor chip to exhibit its own performance.

The process of fabricating the semiconductor device is highly simple because the semiconductor chip can be mounted on the insulating tape by simple flip-chip bonding without the need for a special complex process such as through hole bonding. Moreover, the conductive layer such as the plane layer and the interconnection patterns needs to be formed only on the face side (upper surface) of the insulating tape, and hence a board with interconnections on both surfaces thereof does not need to be used.

The plane layer may provide power supply interconnections, and the interconnection patterns may provide ground interconnections and signal interconnections. Alternatively, the plane layer may provide ground interconnections, and the interconnection patterns may provide power supply interconnections and signal interconnections.

If some of terminals are disposed in the vicinity of the center of the semiconductor chip, then the density of terminals and ends of interconnection patterns on outer peripheral edges of the semiconductor chip is lowered, allowing these terminals and interconnection patterns to be arranged in an easy layout. With the terminals in the vicinity of the center of the semiconductor chip being held in direct contact with the plane layer, no leads are required, the length of the interconnections is reduced, and the impedance thereof is lowered.

The plane layer may provide power supply interconnections and ground interconnections independent of each other, and the interconnection patterns may provide signal interconnections. With this arrangement, the density of terminals and ends of interconnection patterns on outer peripheral edges of the semiconductor chip is lowered, allowing these terminals and interconnection patterns to be arranged in an easy layout. Since a space needed for the interconnection patterns to extend therein is reduced, the semiconductor device can be further reduced in size. The lengths of both the ground interconnections and the power supply interconnections are small and their impedance is low as terminals thereof are held in direct contact with the plane layer without leads.

The semiconductor device may further include a floating plane layer disposed on the reverse side of the insulating tape and electrically insulated from the conductive protrusions. When a current flows through the plane layer and the interconnection patterns, an induced current is generated in the floating plane layer that is electrically independent. The induced current reduces the inductance of the plane layer and the interconnection patterns, and reduces the impedance thereof.

The conductive protrusions may comprise solder balls.

The semiconductor device may further include a support ring disposed on the face side of the insulating tape in surrounding relation to the semiconductor chip. The semiconductor chip and the support ring may have respective upper surfaces lying substantially flush with each other, and the semiconductor device may further include a heat spreader fixedly mounted on the upper surface of the semiconductor chip and the upper surface of the support ring. The support ring and the heat spreader act as reinforcing members to prevent the insulating tape from being easily deformed. Therefore, the conductive protrusions have their height and position maintained with high accuracy, and their defective ratio is held to a low value.

The above and other objects, features, and advantages of the present invention will become apparent from the following description with reference to the accompanying drawings which illustrate examples of the present invention.

DESCRIPTION OF THE PREFERRED EMBODIMENTS

Figure 1A:
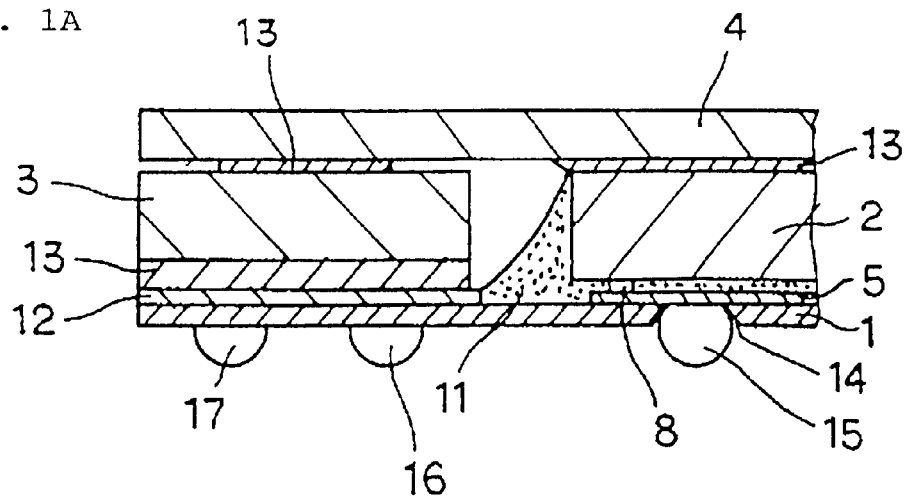
FIGS. 1A through 1C are partial cross-sectional view of a semiconductor device according to a first embodiment of the present invention.
Figure 1B:
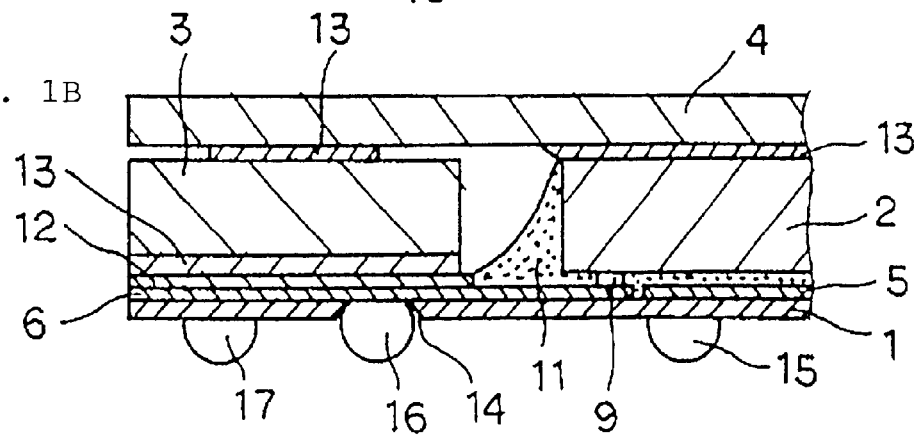
Figure 1C:
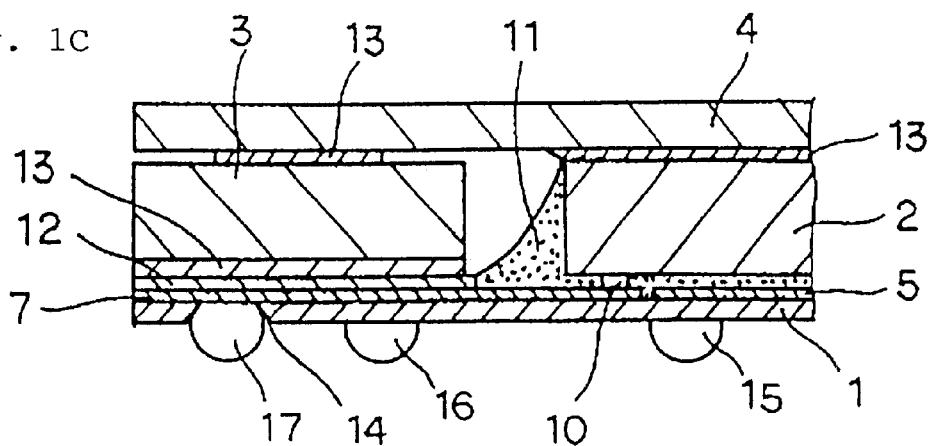
Figure 2:
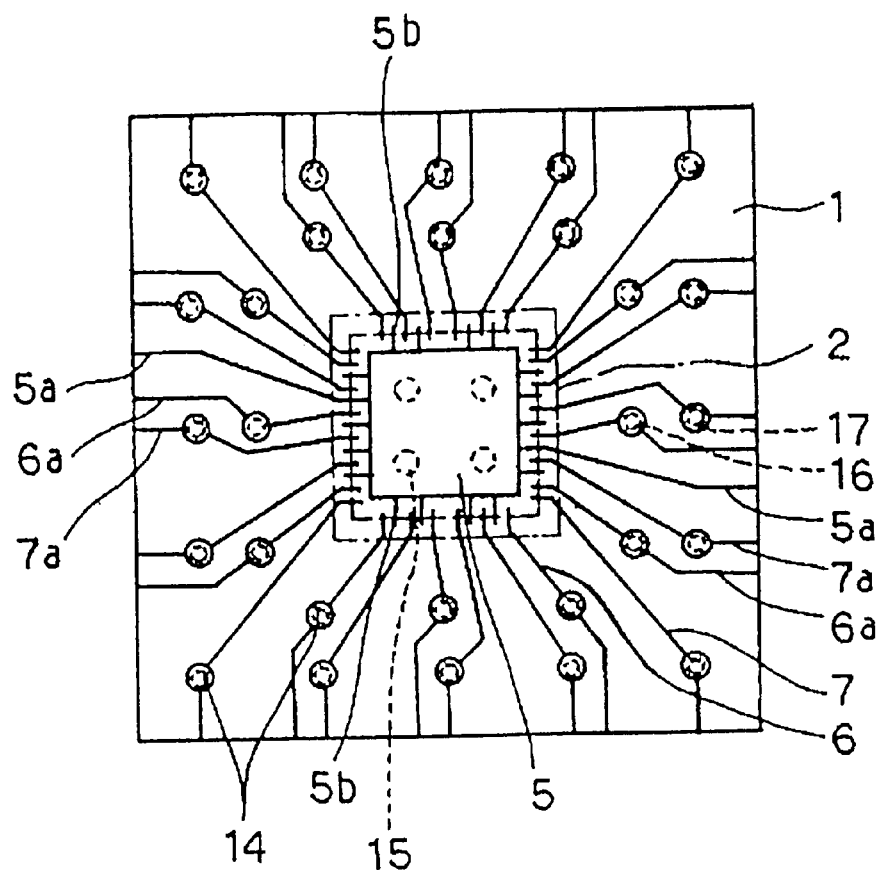
FIG. 2 is a plan view showing the face side of an insulating tape of the semiconductor device according to the first embodiment.

FIGS. 1A through 1C and 2 show a semiconductor device according to a first embodiment of the present invention. FIGS. 1A through 1C are partial cross-sectional views of the semiconductor device taken along different lines across the semiconductor device. Specifically, FIG. 1A is a partial cross-sectional view taken along a line passing through plane layer 5, FIG. 1B is a partial cross-sectional view taken along interconnection pattern 6, and FIG. 1C is a partial cross-sectional view taken along interconnection pattern 7. FIG. 2 schematically shows the face side of an insulating tape where a semiconductor chip is installed. In FIG. 2, an area where semiconductor chip 2 is installed is indicated by the chain line, and positions where terminals 8, 9, 10 of semiconductor chip 2 are arrayed are indicated by the dotted line.

An overall structure of the semiconductor device according to the first embodiment will first be described below. A conductive layer 5,6,7 is disposed on an upper surface of flexible insulating tape 1, and semiconductor chip 2 is mounted on the conductive layer 5,6,7. Support ring 3 is disposed on insulating tape 1 in surrounding relation to semiconductor chip 2. Semiconductor chip 2 and support ring 3 have respective upper surfaces lying substantially flush with each other, and heat spreader 4 as a heat radiating plate is fixedly mounted on upper surfaces of semiconductor chip 2 and support ring 3. Sealing resin (underfill resin) 11 is filled and solidified between semiconductor chip 2 and support ring 3. Support ring 3 has a lower surface bonded to solder resist layer 12 on insulating tape 1 by adhesive 13. Heat spreader 4 has a lower surface bonded to the upper surfaces of support ring 3 and semiconductor chip 2 by adhesive 13.

The conductive layer 5,6,7 disposed on the upper surface of flexible insulating tape 1 is divided into an underlying layer disposed in a region substantially directly beneath semiconductor chip 2 and a peripheral layer disposed in a region substantially around the underlying layer. In the present embodiment, the underlying layer comprises plane layer (solid pattern) 5, and the peripheral layer comprises a number of thin filamentary interconnection patterns 6, 7. A number of terminals (pads) 8, 9, 10 are mounted on the reverse side (lower surface) of semiconductor chip 2. In the present embodiment, these terminals are divided into three groups according to paths of electric connection, the groups being denoted by different reference numerals. When semiconductor chip 2 is mounted on insulating tape 1 by flip-chip bonding, terminals 8 are electrically connected to leads 5*b* (see FIG. 2) of plane layer 5 in direct contact therewith, and other terminals 9, 10 are electrically connected to ends of interconnection patterns 6, 7 in contact therewith.

Strictly, ends of interconnection patterns 6, 7 extend into regions below the outer peripheral edges of semiconductor chip 2 where terminals 9, 10 are disposed. Such a structure should be interpreted to be covered by the structure that interconnection patterns 6, 7 are disposed in the region around semiconductor chip 2.

Terminals 8, 9, 10 are made of gold, and plane layer 5 and interconnection patterns 6, 7 are made of copper electrolytically plated with gold. Plating interconnections 5*a*, 6*a*, 7*a* extending outwardly for electrolytically plating gold to produce plane layer 5 and interconnection patterns 6, 7 are provided respectively to plane layer 5 and interconnection patterns 6, 7. These plating interconnections 5*a*, 6*a*, 7*a* have no function at all in the completed semiconductor device. Though single plating interconnection 5*a* may extend from plane layer 5, two plating interconnections 5*a* are employed for increased reliability.

Insulating tape 1 has a number of openings 14 defined therein, and solder balls (conductive protrusions) 15, 16, 17 are disposed in openings 14. In the present embodiment, solder balls 15, 16, 17 are divided into three groups according to paths of electric connection, the groups being denoted by different reference numerals. Solder balls 15, 16, 17 are electrically connected respectively to plane layer 5 and interconnection patterns 6, 7 in contact therewith.

As shown in FIG. 1A, terminals 8 of semiconductor chip 2 are connected through plane layer 5 to solder balls 15. As shown in FIG. 1B, terminals 9 of semiconductor chip 2 are connected through interconnection patterns 6 to solder balls 16. As shown in FIG. 1C, terminals 10 of semiconductor chip 2 are connected through interconnection patterns 7 to solder balls 17. Thus, there are three types of conduction routes extending from semiconductor chip 2 to outer circuits. In the present embodiment, the first conduction route, i.e., an electric path from terminals 8 through plane layer 5 to solder balls 15 functions as ground interconnections to which a ground potential is applied. The second conduction route, i.e., an electric path from terminals 9 through interconnection patterns 6 to solder balls 16 functions as power supply interconnections to which a power supply potential is applied. The third conduction route, i.e., an electric path from terminals 10 through interconnection patterns 7 to solder balls 17 functions as signal interconnections to which various electric signals are applied.

A process of fabricating the semiconductor device according to the first embodiment will be described below with reference to FIGS. 3A through 3F.

First, a conductive layer of copper which will serve as plane layer 5 including leads 5*b*, interconnection patterns 6, 7, and plating interconnections 5*a*, 6*a*, 7*a* is deposited on the upper surface of insulating tape 1. Using plating interconnections 5*a*, 6*a*, 7*a*, the conductive layer is electrolytically plated with gold. Then, a solder resist layer 12 is deposited as a protective layer on the plated gold film. Then, a plurality of openings 14 for accommodating solder balls (conductive protrusions) 15, 16, 17 are defined in the insulating tape 1. The conductive layer is positioned over openings 14 (see FIG. 3A).

Figure 3A:
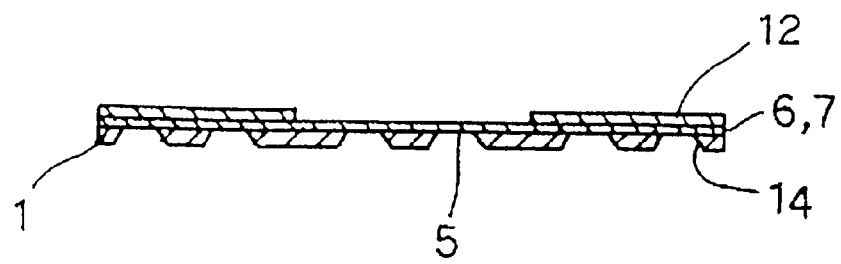
FIGS. 3A through 3F are cross-sectional views showing a process of fabricating the semiconductor device according to the first embodiment.
Figure 3B:
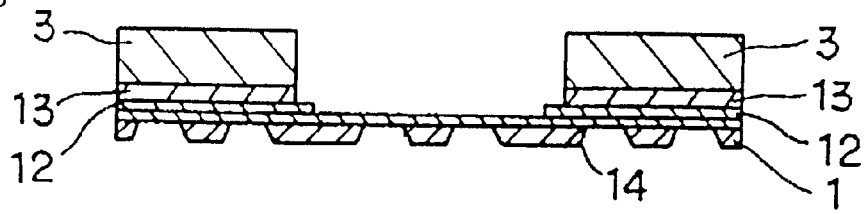

Thereafter, as shown in FIG. 3B, support ring 3 of metal is mounted on solder resist layer 12 in surrounding relation to a region where semiconductor chip 2 will be installed. Support ring 3 is bonded to solder resist layer 12 by adhesive 13 at normal temperature, or thermally tightened with heat.

Figure 3C:
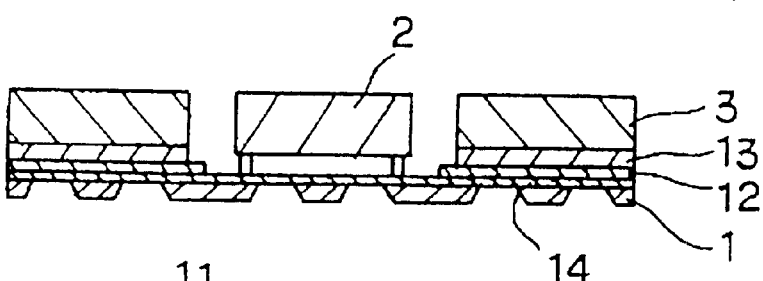

Then, as shown in FIG. 3C, semiconductor chip 2 is mounted on insulating tape 1 by flip-chip bonding. Semiconductor chip 2 is fixed to insulating tape 1 with heat and pressure.

Figure 3D:
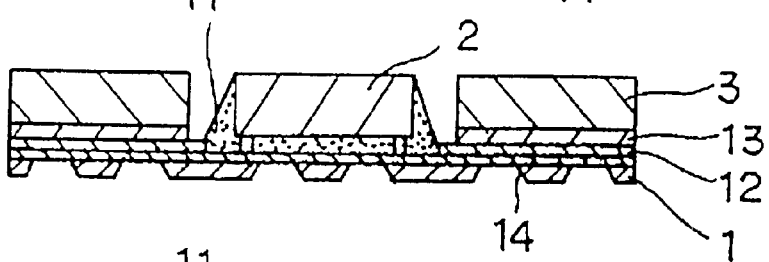

As shown in FIG. 3D, sealing resin (underfill resin) 11 is filled around and beneath semiconductor chip 2, and thermally tightened with heat. Semiconductor chip 2 is now firmly fixed in position by sealing resin 11.

Figure 3E:
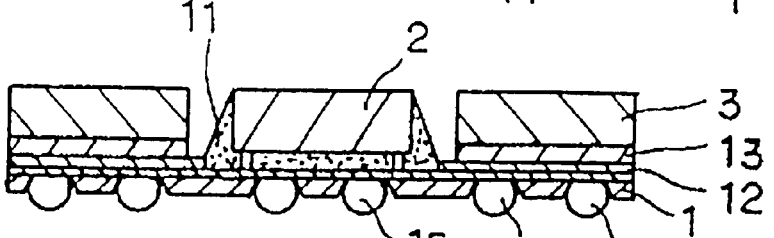

As shown in FIG. 3E, solder balls 15, 16, 17 are placed respectively in openings 14 from the reverse side of insulating tape 1. Then, solder balls 15, 16, 17 are melted with heat, brought into contact with and electrically connected to the conductive layer, and fixed. Solder balls 15, 16, 17 are fixed so as to project from the reverse side of insulating tape 1.

Figure 3F:
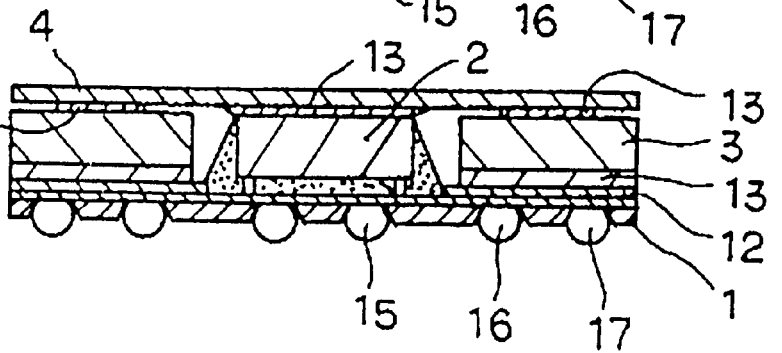

As shown in FIG. 3F, heat spreader 4 of metal is bonded to upper surfaces of semiconductor chip 2 and support ring 3 by adhesive 13.

In the conventional semiconductor device, there are as many filamentary interconnection patterns as the number of terminals. According to the present embodiment, however, the ground interconnections for supplying a certain ground potential include a number of terminals 8 connected to single plane layer 5. Therefore, the ground interconnections are simple in structure as a number of fine interconnection patterns do not need to be placed in a complex layout. Furthermore, since the region directly beneath semiconductor chip 2 is effectively utilized for electric interconnections including plane layer 5 and solder balls 15, the semiconductor device may be reduced in size. Because the length of interconnections from terminals 8 to solder balls 15 is small, the impedance thereof is small and the electric characteristics thereof are improved, allowing semiconductor chip 2 to exhibit its own intrinsic performance. Specifically, whereas the inductance of the electric interconnections of the conventional semiconductor device has ranged from 3–5 nH, the inductance of the electric interconnections of the semiconductor device according to the present embodiment is reduced to 0.1–0.5 nH, thus reducing the impedance thereof.

The process of fabricating the semiconductor device according to the present embodiment is highly simple because semiconductor chip 2 can be mounted on insulating tape 1 by simple flip-chip bonding without the need for a special complex process such as through hole bonding. In the present embodiment, moreover, the conductive layer needs to be formed only on the face side (upper surface) of insulating tape 1, and hence a board with interconnections on both surfaces thereof does not need to be used. As a result, the semiconductor device according to the present embodiment is highly simple in structure and fabrication process.

In the present embodiment, semiconductor chip 2 and support ring 3 have respective upper surfaces lying substantially flush with each other, and heat spreader 4 is bonded to the upper surfaces of semiconductor chip 2 and support ring 3. Therefore, support ring 3 and heat spreader 4 act as reinforcing members, preventing insulating tape 1 from being easily deformed. Solder balls 15, 16, 17 have their height and position maintained with high accuracy, and their defective ratio is held to a low value.

Figure 4A:
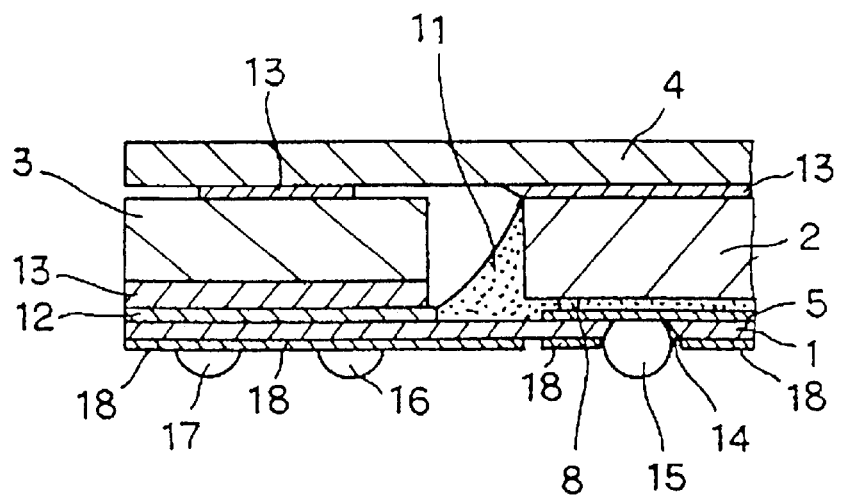
FIGS. 4A through 4C are partial cross-sectional view of a semiconductor device according to a second embodiment of the present invention.
Figure 4B:
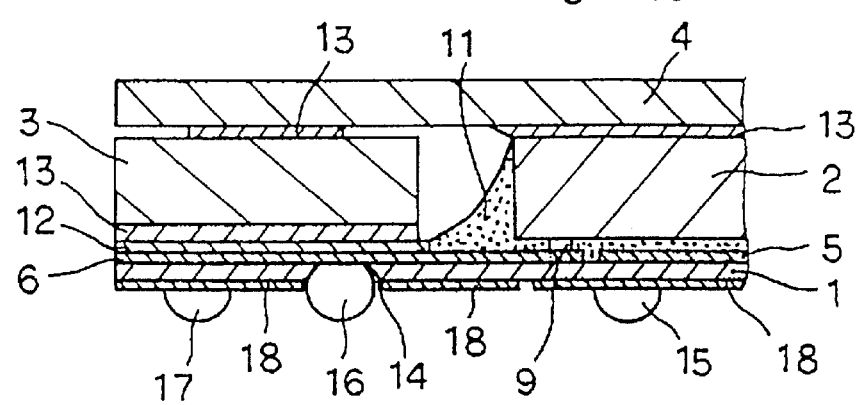
Figure 4C:
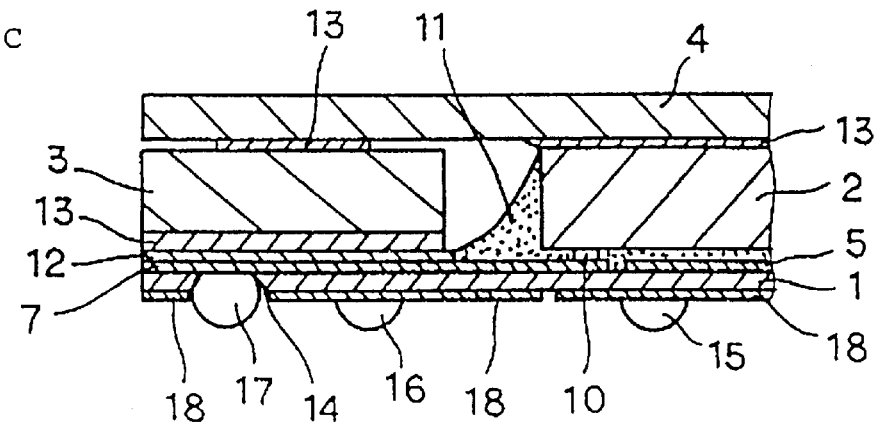
Figure 5:
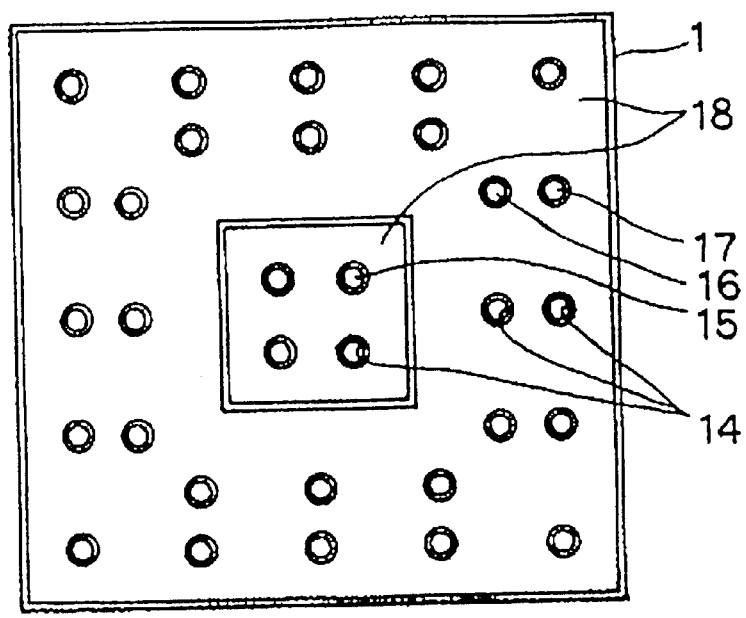
FIG. 5 is a plan view showing the reverse side of an insulating tape of the semiconductor device according to the second embodiment.

A semiconductor device according to a second embodiment of the present invention will be described below with reference to FIGS. 4A through 4C and 5. FIGS. 4A through 4C are partial cross-sectional views of the semiconductor device taken along different lines across the semiconductor device. Specifically, FIG. 4A is a partial cross-sectional view taken along a line passing through plane layer 5, FIG. 4B is a partial cross-sectional view taken along interconnection pattern 6, and FIG. 4C is a partial cross-sectional view taken along interconnection pattern 7. FIG. 5 schematically shows the reverse side (lower surface) of an insulating tape 1. Those parts of the semiconductor device according to the second embodiment which are identical to those of the semiconductor device according to the first embodiment are denoted by identical reference numerals, and will not be described in detail below.

In the second embodiment, floating plane layer 18 is disposed on the reverse side (lower surface) of insulating tape 1. Floating plane layer 18 is an entirely independent conductive layer that is not electrically connected to solder balls 15, 16, 17, plane layer 5, interconnection patterns 6, 7, and any other members at all. When a current flows through plane layer 5 and interconnection patterns 6, 7, (nearby conductive layer) on the surface, an induced current is generated in floating plane layer 18 that is electrically independent. The induced current reduces the inductance of plane layer 5 and interconnection patterns 6, 7 on the surface, and reduces the impedance thereof. This principle is disclosed in "Reduced parasitic inductances in BGA package using floating conductive plane" reported in the Institute of Electronics, Information and Communication Engineers by Takeshi Ishihara et al. of Hitachi Cable Ltd., CPM 99-134, ICD 99-230 (December, 1999).

In the second embodiment, the above theory is applied to reduce the impedance to substantially one half of the impedance in the semiconductor device according to the first embodiment.

Figure 6A:
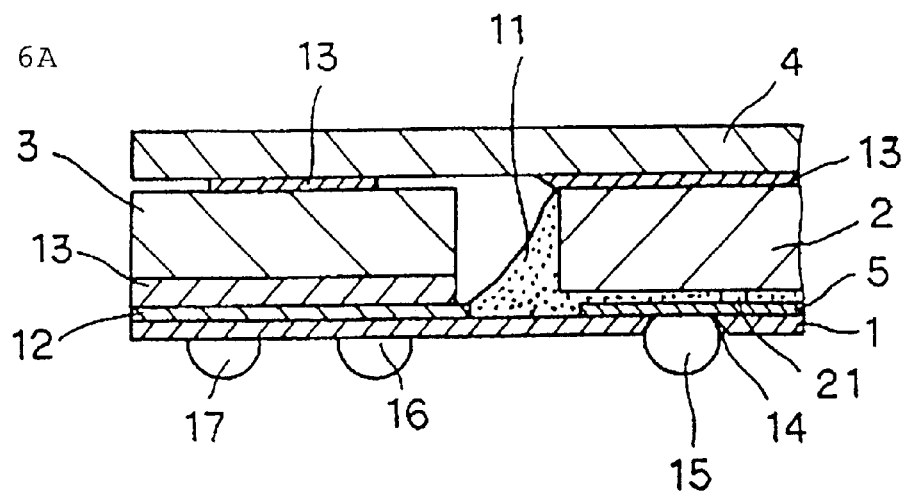
FIGS. 6A through 6C are partial cross-sectional view of a semiconductor device according to a third embodiment of the present invention.
Figure 6B:
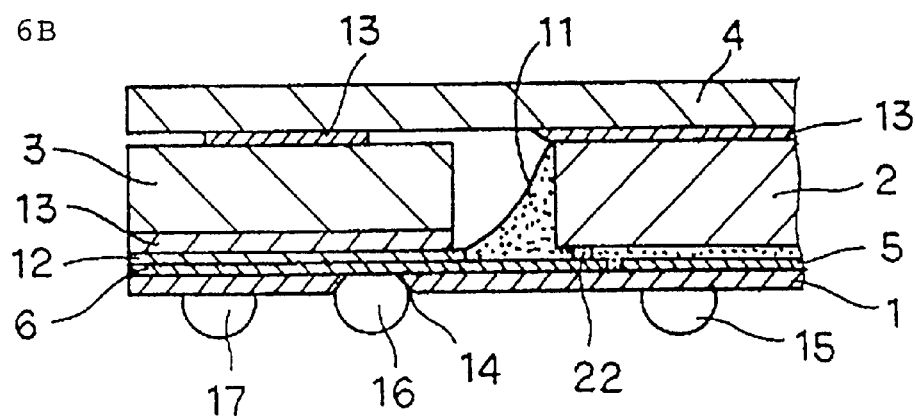
Figure 6C:
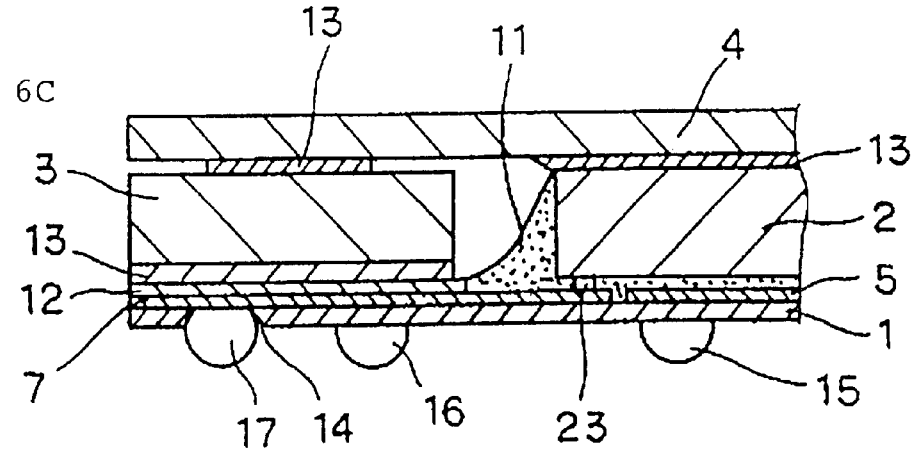
Figure 7:
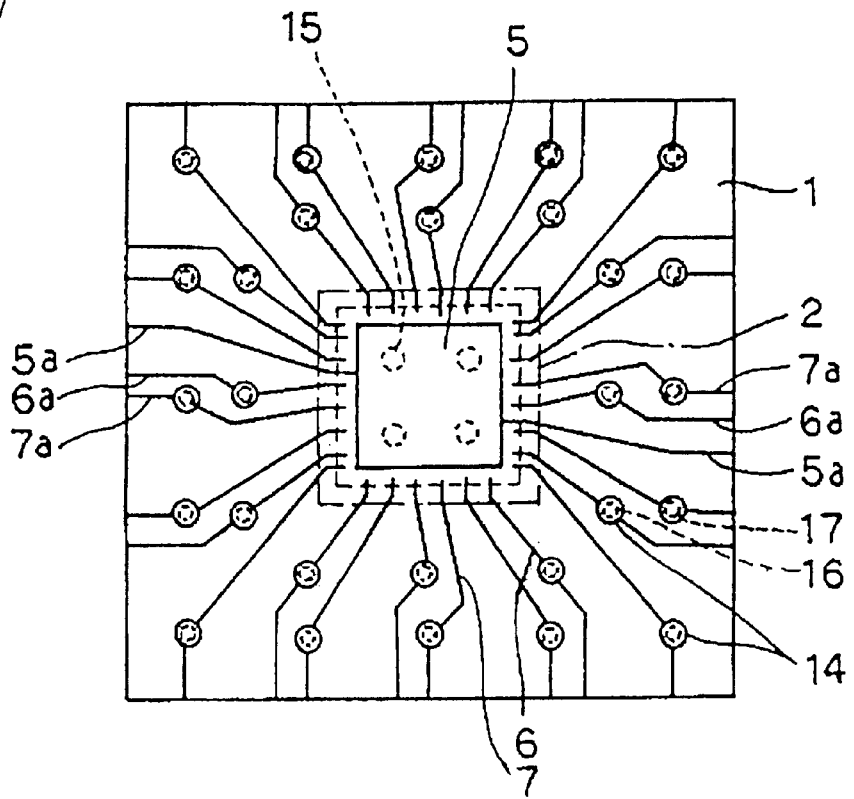
FIG. 7 is a plan view showing the face side of an insulating tape of the semiconductor device according to the third embodiment.

A semiconductor device according to a third embodiment of the present invention will be described below with reference to FIGS. 6A through 6C and 7. FIGS. 6A through 6C are partial cross-sectional views of the semiconductor device taken along different lines across the semiconductor device. Specifically, FIG. 6A is a partial cross-sectional view taken along a line passing through plane layer 5, FIG. 6B is a partial cross-sectional view taken along interconnection pattern 6, and FIG. 6C is a partial cross-sectional view taken along interconnection pattern 7. FIG. 7 schematically shows the face side of an insulating tape 1 where a semiconductor chip is installed. In FIG. 7, an area where semiconductor chip 2 is installed is indicated by the chain line, and positions where terminals 22, 23 of semiconductor chip 2 are arrayed are indicated by the dotted line. Those parts of the semiconductor device according to the third embodiment which are identical to those of the semiconductor devices according to the first and second embodiments are denoted by identical reference numerals, and will not be described in detail below.

In the first and second embodiments, a number of terminals 8, 9, 10 are arrayed at equal intervals around semiconductor chip 2. As shown in FIG. 2, ends of interconnection patterns 6, 7 and leads 5b of plane layer 5, which correspond to the respective terminals, are arrayed in a rectangular pattern. In the third embodiment, however, some terminals, or specifically, terminals 21 connected to plane layer 5 and providing ground interconnections are disposed on the reverse side (lower surface) of semiconductor chip 2 relatively closely to the center thereof, and held in direct contact with plane layer 5 without leads. Remaining terminals 22, 23 providing power supply interconnections and signal interconnections are arrayed in a rectangular pattern around semiconductor chip 2. Terminals 22, 23 around semiconductor chip 2 and ends of interconnection patterns 6, 7 are arranged at a density lower than the density of those in the first and second embodiments, and hence can be arranged in greater ease. The length of the ground interconnections is small and their impedance is low as terminals 21 thereof are held in direct contact with plane layer 5 without leads.

In the first, second, and third embodiments, the ground interconnections and the power supply interconnections may be switched such that the electric path from terminals 8, 21 through plane layer 5 to solder balls 15 (first conduction route) functions as power supply interconnections, the electric path from terminals 9, 22 through interconnection patterns 6 to solder balls 16 (second conduction route) functions as ground interconnections, and the electric path from terminals 10, 23 through interconnection patterns 7 to solder balls 17 (third conduction route) functions as signal interconnections. Since the same potential may be applied to all the terminals connected to the power supply interconnections, and similarly the same potential may be applied to all the terminals connected to the ground interconnections, these interconnections may include the plane layer. Particularly, those interconnections whose impedance is to be reduced should be arranged to include the plane layer. However, the signal interconnections have to comprise a number of thin filamentary interconnection patterns as signals are independently supplied to the respective terminals thereof and the signal interconnections cannot include the plane layer.

Figure 8A:
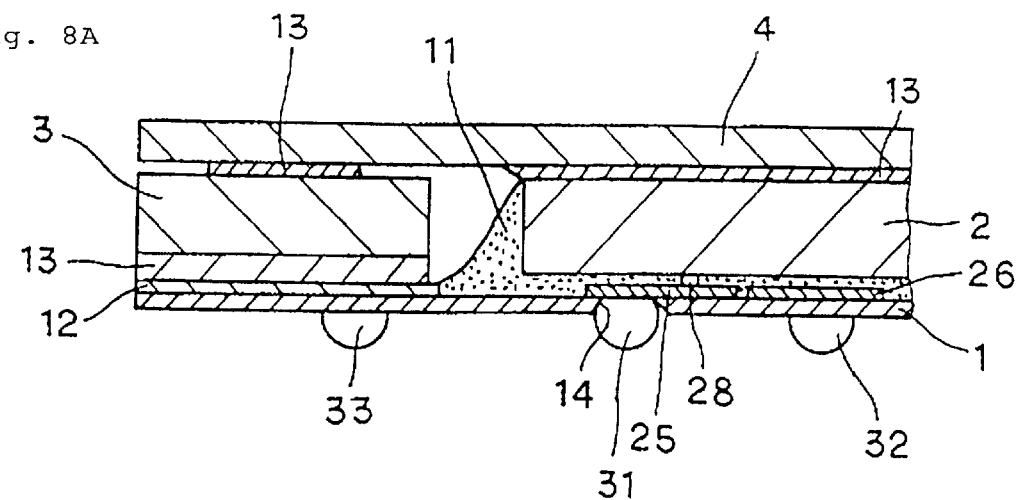
FIGS. 8A through 8C are partial cross-sectional view of a semiconductor device according to a fourth embodiment of the present invention.
Figure 8B:
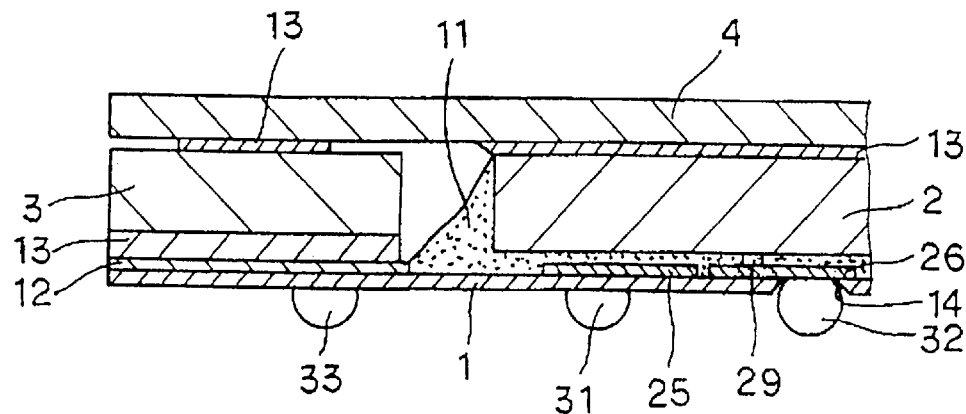
Figure 8C:
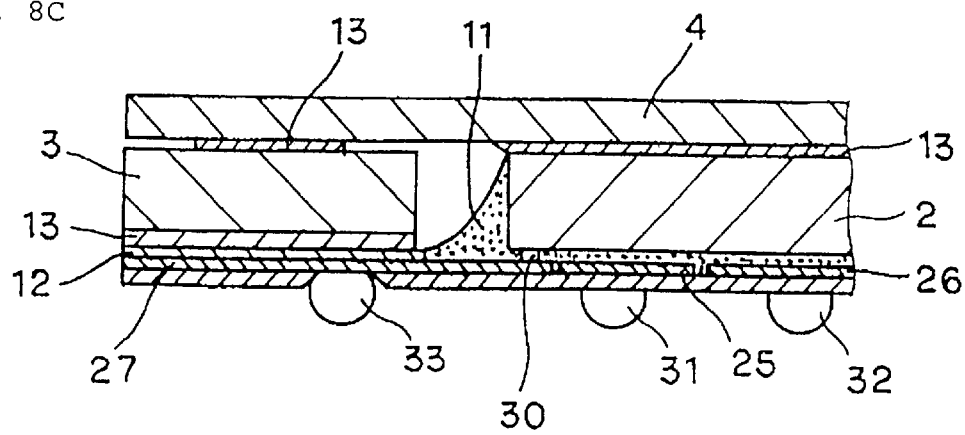
Figure 9:
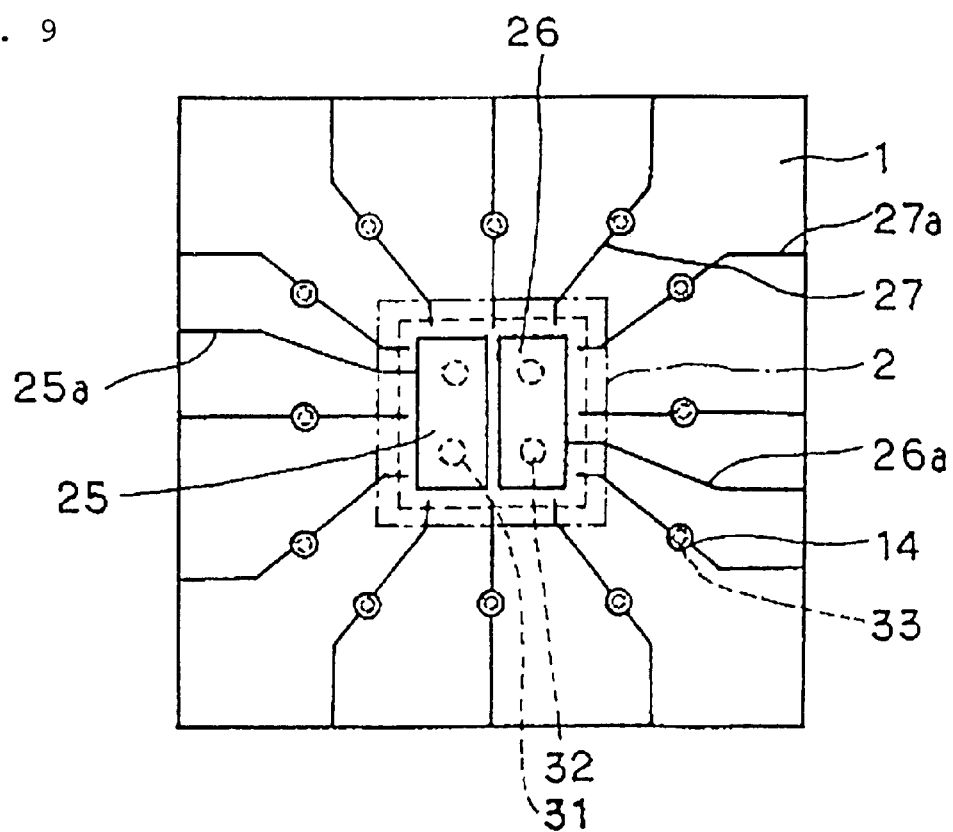
FIG. 9 is a plan view showing the face side of an insulating tape of the semiconductor device according to the fourth embodiment.

A semiconductor device according to a fourth embodiment of the present invention will be described below with reference to FIGS. 8A through 8C and 9. FIGS. 8A through 8C are partial cross-sectional views of the semiconductor device taken along different lines across the semiconductor device. Specifically, FIG. 8A is a partial cross-sectional view taken along a line passing through plane layers 25, 26, FIG. 8B is a partial cross-sectional view taken another line passing through plane layers 25, 26, and FIG. 8C is a partial cross-sectional view taken along interconnection pattern 27. FIG. 9 schematically shows the face side of insulating tape 1 where a semiconductor chip 2 is installed. In FIG. 9, an area where semiconductor chip 2 is installed is indicated by the chain line, and positions where terminals 30 of semiconductor chip 2 are arrayed are indicated by the dotted line. Those parts of the semiconductor device according to the fourth embodiment which are identical to those of the semiconductor devices according to the first, second, and third embodiments are denoted by identical reference numerals, and will not be described in detail below.

In the fourth embodiment, two plane layers 25, 26 independent of each other are disposed in a region substantially directly beneath semiconductor chip 2. Of the terminals of semiconductor chip 2, terminals 28 connected to first plane layer 25 and providing ground interconnections and terminals 29 connected to second plane layer 26 and providing power supply interconnections are disposed on the reverse side (lower surface) of semiconductor chip 2 relatively closely to the center thereof, and held in direct contact with plane layers 25, 25 without leads. Only remaining terminals 30 providing signal interconnections are arrayed in a rectangular pattern around semiconductor chip 2. Plane layers 25, 26 are associated with plating interconnections 25a, 26a, and interconnection patterns 27 are associated with plating interconnections 27a.

In the fourth embodiment, the ground interconnections extend from terminals 28 through plane layer 25 to solder balls 31, the power supply interconnections extend from terminals 29 through plane layer 26 to solder balls 32, and signal interconnections extend from terminals 30 through interconnection patterns 27 to solder balls 33. Since the number of terminals 30 and ends of interconnection patterns 27 disposed around semiconductor chip 2 is very small, they can easily arranged in position, and a spaced required for interconnection patterns 27 to extend therein is small. The semiconductor device can,thus be reduced in size. The lengths of both the ground interconnections and the power supply interconnections are small and their impedance is low as terminals 28, 29 thereof are held in direct contact with plane layers 25, 26 without leads.

While preferred embodiments of the present invention have been described using specific terms, such description is for illustrative purposes only, and it is to be understood that changes and variations may be made without departing from the spirit or scope of the following claims.

What is claimed is:

1. A semiconductor device comprising:

a flexible insulating tape;

a semiconductor chip mounted on a face side of said insulating tape;

a plane layer on the face side of the insulating tape limited within an area defined by a periphery of the semiconductor chip and held in direct contact with selected ones of a plurality of terminals of said semiconductor chip;

a plurality of filamentary interconnection patterns on the face side of the insulating tape around a peripheral edge of said semiconductor chip, electrically independent of said plane layer, and in contact with remaining ones of said terminals of said semiconductor chip; and a plurality of conductive protrusions in respective openings of said insulating tape and exposed on a reverse side of said insulating tape.

2. The semiconductor device according to claim 1, wherein said plane layer provides power supply interconnections, and said interconnection patterns provide ground interconnections and signal interconnections.

3. The semiconductor device according to claim 1, wherein said plane layer provides ground interconnections, and said interconnection patterns provide power supply interconnections and signal interconnections.

4. The semiconductor device according to claim 1, wherein said plane layer provides power supply interconnections and ground interconnections independent of each other, and said interconnection patterns provide signal interconnections.

5. The semiconductor device according to claim 1, further comprising:

a floating plane layer disposed on the reverse side of said insulating tape and electrically insulated from said conductive protrusions.

6. The semiconductor device according to claim 1, wherein said conductive protrusions comprise solder balls.

7. The semiconductor device according to claim 1, further comprising:

a support ring disposed on the face side of said insulating tape in surrounding relation to said semiconductor chip.

8. A semiconductor device according to claim 7, wherein said semiconductor chip and said support ring have respective upper surfaces lying substantially flush with each other, further comprising:

a heat spreader fixedly mounted on the upper surface of said semiconductor chip and the upper surface of said support ring.

9. The semiconductor device according to claim 1, wherein said conductive protrusions directly contact one of said plane layer and said interconnection patterns.

* * * * *